(12) United States Patent
Ichimura (10) Patent No.: US 8,441,879 B2
(45) Date of Patent: May 14, 2013

(54) SEMICONDUCTOR MEMORY DEVICE REQUIRING REFRESH OPERATION

(75) Inventor: Toshiyuki Ichimura, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 503 days.

(21) Appl. No.: 12/692,116

(22) Filed: Jan. 22, 2010

(65) Prior Publication Data
US 2010/0182864 A1 Jul. 22, 2010

(30) Foreign Application Priority Data
Jan. 22, 2009 (JP) ................................. 2009-012077

(51) Int. Cl.
*G11C 7/22* (2006.01)
(52) U.S. Cl.
USPC ........... 365/222; 365/226; 365/227; 365/228; 365/229
(58) Field of Classification Search ................. 365/222, 365/226, 227, 228, 229
See application file for complete search history.

(56) References Cited

U.S. PATENT DOCUMENTS

| | | | | |
|---|---|---|---|---|
| 6,618,314 | B1* | 9/2003 | Fiscus et al. .................. | 365/227 |
| 2001/0012230 | A1* | 8/2001 | Takemae et al. .............. | 365/222 |
| 2001/0021137 | A1* | 9/2001 | Kai et al. ...................... | 365/222 |
| 2002/0163845 | A1* | 11/2002 | Ooishi et al. ................. | 365/222 |
| 2002/0191466 | A1* | 12/2002 | Hwang et al. ................. | 365/222 |
| 2003/0053366 | A1* | 3/2003 | Lee ................................ | 365/236 |
| 2003/0218930 | A1* | 11/2003 | Lehmann et al. ............. | 365/222 |
| 2004/0027902 | A1* | 2/2004 | Ooishi et al. ................. | 365/222 |
| 2004/0032772 | A1* | 2/2004 | Takahashi ..................... | 365/202 |
| 2004/0179416 | A1* | 9/2004 | Ikeda et al. ................... | 365/222 |
| 2006/0133173 | A1* | 6/2006 | Jain et al. ..................... | 365/222 |
| 2006/0171241 | A1* | 8/2006 | Nam ........................ | 365/230.06 |
| 2007/0019491 | A1* | 1/2007 | Jang et al. .................... | 365/222 |
| 2007/0253268 | A1* | 11/2007 | Kim et al. .................... | 365/222 |
| 2008/0291765 | A1* | 11/2008 | Smith ............................ | 365/222 |
| 2009/0109783 | A1* | 4/2009 | Lee ............................... | 365/222 |

FOREIGN PATENT DOCUMENTS
JP 2008-276878 A 11/2008

* cited by examiner

*Primary Examiner* — Huan Hoang
*Assistant Examiner* — Jay Radke
(74) *Attorney, Agent, or Firm* — Sughrue Mion, PLLC (57) ABSTRACT

To provide a plurality of memory banks, each of which is divided into a plurality of segments; a bank address register that designates a memory bank that becomes a refresh target; a segment address register that designates a segment that becomes a refresh target; and a refresh control circuit that prohibits a refresh operation of the memory bank or the segment not designated by at least one of the bank address register and the segment address register. This semiconductor device is capable of designating whether to perform a refresh operation not only in a memory bank unit but also in a segment unit within the memory bank, and thus it achieves a further reduction of the power consumption.

3 Claims, 7 Drawing Sheets

SEMICONDUCTOR MEMORY DEVICE REQUIRING REFRESH OPERATION

BACKGROUND OF THE INVENTION

1. Field of the Invention

The present invention relates to a semiconductor memory device, and more particularly relates to a semiconductor memory device that requires a refresh operation, such as a DRAM (Dynamic Random Access Memory).

2. Description of Related Art

As is well known, a DRAM, which is a typical semiconductor memory device, requires a periodical refresh operation to hold data. Meanwhile, a technique referred to as "partial refresh" has been proposed to satisfy the increasing demand for reducing the power consumption of the DRAM in recent years (see Japanese Patent Application Laid-open No. 2008-276878).

According to the "partial refresh", a refresh operation is performed only on selected memory banks among a plurality of memory banks included in a DRAM, and the refresh operation is not performed on the rest of the memory banks. This technique enables omission of the refresh operation for memory banks which do not need to hold data, and thus it becomes possible to reduce the power consumption.

However, in the partial refresh technique described in Japanese Patent Application Laid-open No. 2008-276878, whether to perform a refresh operation can be designated only in a memory bank unit. Therefore, it is necessary to perform a refresh operation on all of the addresses for a memory bank in which there is only a small amount of data to be held, and thus a sufficient power-consumption reduction effect is not always provided.

SUMMARY

The present invention seeks to solve one or more of the above problems, or to improve upon those problems at least in part.

In one embodiment, there is provided a semiconductor memory device that includes at least one memory bank that includes a plurality of memory cells and is divided into a plurality of segments and a refresh counter that generates a refresh address. The semiconductor memory device is configured to perform in both a first operation mode in which, among memory cells designated by the refresh address, memory cells belonging to all of the segments within the memory bank are refreshed and a second operation mode in which, among the memory cells designated by the refresh address, a memory cell in a designated segment within the memory bank is refreshed, and a memory cell in an undesignated segment is not refreshed.

In another embodiment, there is provided a semiconductor memory device that includes a register that holds first address information and a determining circuit that compares second address information generated in response to an input of a refresh command and the first address information. When the determining circuit determines that the second address information is included in the first address information, the refresh operation corresponding to the second address information is not performed.

In another embodiment, there is provided a semiconductor memory device that includes a plurality of memory banks that is divided into a plurality of segments respectively, a bank address register that designates a memory bank that becomes a refresh target among the memory banks, a segment address register that designates a segment that becomes a refresh target among the segments and a refresh control circuit that prohibits a refresh operation of the memory bank or the segment not designated by at least one of the bank address register and the segment address register.

According to the present invention, it is possible to designate whether to perform a refresh operation in a segment unit within a memory bank, and thus it becomes possible to achieve a further reduction of the power consumption as compared to the partial refresh in conventional techniques.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
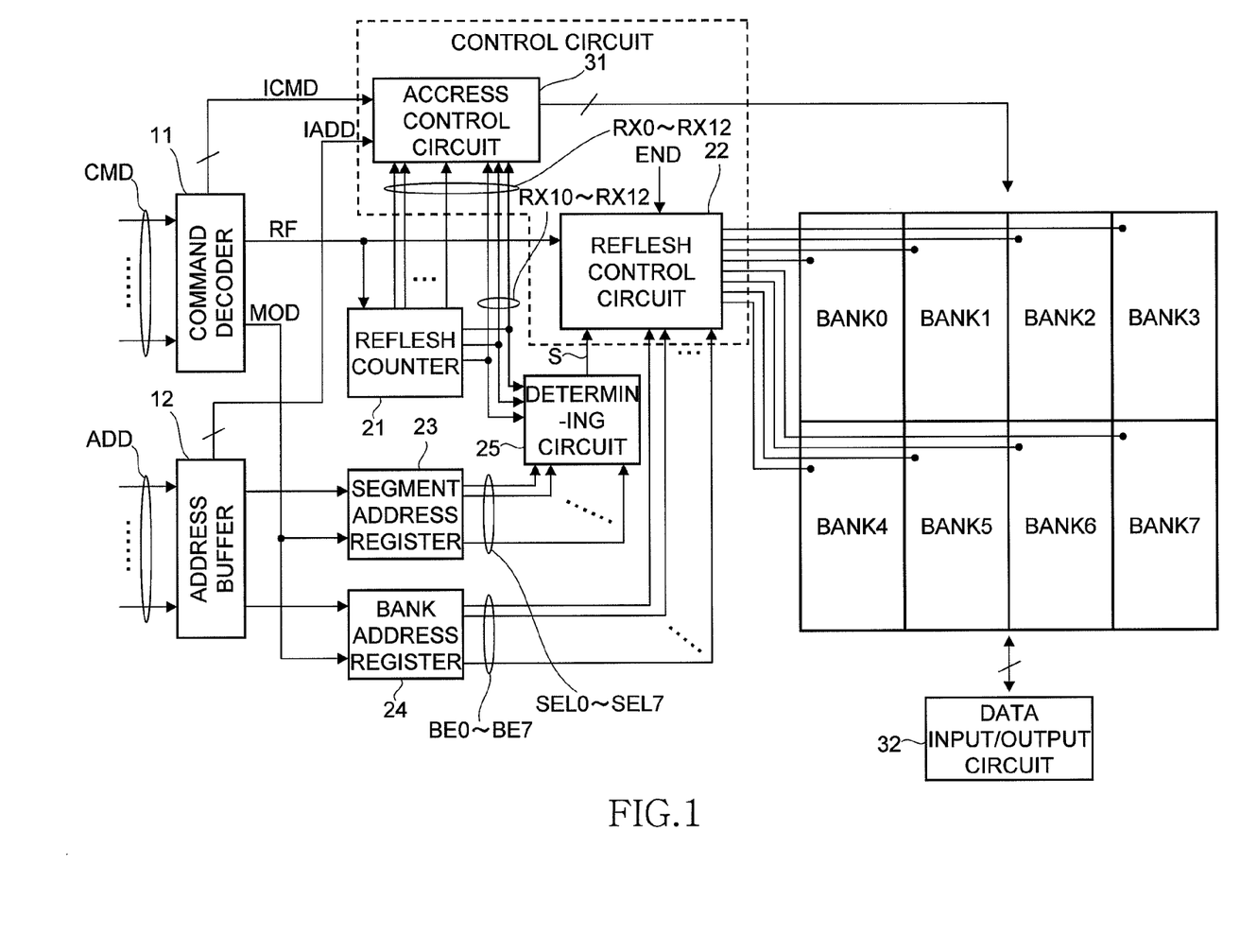
FIG. 1 is a block diagram showing a configuration of main parts of a semiconductor memory device according to an embodiment of the present invention.

FIG. 1 is a block diagram showing a configuration of main parts of a semiconductor memory device according to an embodiment of the present invention.

As shown in FIG. 1, the semiconductor memory device according to the present embodiment includes eight memory banks BANK0 to BANK7. Although not shown, these memory banks include a plurality of memory cells, and as described later, each of the memory banks is divided into a plurality of segments. The memory bank is a unit capable of independently receiving a command. In the present invention, it is not essential to provide a plurality of memory banks. However, when a plurality of memory banks are provided as in the present embodiment, a parallel operation can be performed.

Access to memory cells included in each memory bank are performed based on a command CMD and an address ADD from outside the semiconductor memory device.

The command CMD supplied from outside is supplied to a command decoder 11 shown in FIG. 1, and is decrypted by the command decoder 11. The command decoder 11 generates various internal commands including ICMD, RF, and MOD based on a decryption result of the command CMD.

The refresh command RF is an internal command that becomes active when a refresh command is issued from outside, and is supplied to a refresh counter 21 and a refresh control circuit 22 shown in FIG. 1. However, in case of a self-refresh mode, the command decoder 11 automatically generates the refresh command RF. Accordingly, the refresh command RF of the present invention does not always need to be based on the command CMD issued from outside.

The mode signal MOD is an internal command that is activated when a mode setting command is issued from outside, and is supplied to a segment address register 23 and a bank address register 24 shown in FIG. 1.

The address ADD supplied from outside is supplied to an address buffer 12 shown in FIG. 1. The address buffer 12 receives the address ADD supplied from outside, and supplies this address, as an internal address IADD, to an access control circuit 31. The access control circuit 31 controls the access to the memory banks BANK0 to BANK7 based on the internal address IADD and the internal command ICMD.

More specifically, when the internal command ICMD indicates a row active command, the access control circuit 31 receives the internal address IADD as a row address, and performs row access (selection of a word line) to the memory banks BANK0 to BANK7. When the internal command ICMD indicates a column active command, such as a read command or a write command, the access control circuit 31 receives the internal address IADD, as a column address, and performs column access (selection of a bit line) to the memory banks BANK0 to BANK7. The memory cell thus selected is connected to a data input/output circuit 32 shown in FIG. 1. Accordingly, read data read from the selected memory cell is output to outside, or write data input from outside is written in the selected memory cell.

A part of the address ADD received by the address buffer 12 is supplied also to the segment address register 23 and the bank address register 24. The segment address register 23 and the bank address register 24 are circuits that store a part of the address ADD when the mode signal MOD supplied from the command decoder 11 is active. In the present embodiment, a bank address used for selecting the memory banks BANK0 to BANK7 is stored in the bank address register 24, and an upper address used for selecting a segment within the bank is stored in the segment address register 23.

Figure 2:
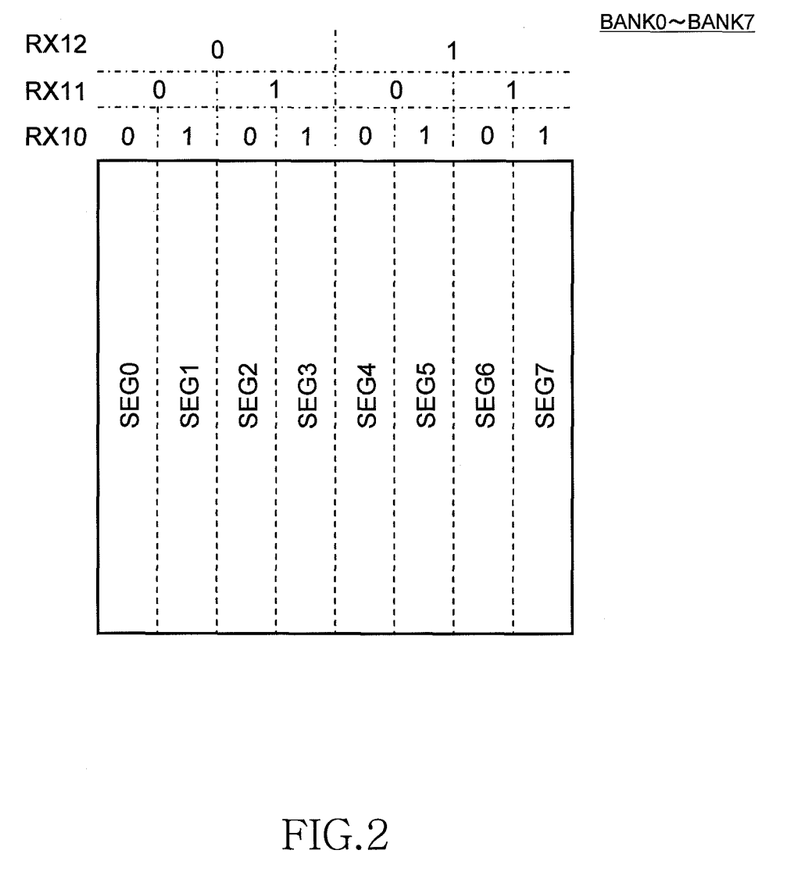
FIG. 2 is a schematic diagram for explaining a segment structure within each of the memory banks.

FIG. 2 is a schematic diagram for explaining a segment structure within each of the memory banks BANK0 to BANK7.

As shown in FIG. 2, each of the memory banks BANK0 to BANK7 is divided into eight segments SEG0 to SEG7. In the present embodiment, each segment is designated by upper three bits of a row address RX in the memory bank. In the present embodiment, the row address is a 13-bit configuration including RX0 to RX12. Among these bits, by the upper three bits RX10 to RX12 including a most significant bit, the segment is designated.

The refresh counter 21 generates a refresh address in response to activation of the refresh command RF. The refresh addresses are row addresses RX0 to RX12 that become refresh targets, and are common to each memory bank. The refresh addresses RX0 to RX12 are supplied to the access control circuit 31, and thereby, a row address designated within each of the memory banks BANK0 to BANK7 is refreshed. The refresh counter 21 increments (or decrements) the refresh address at each activation of the refresh command RF.

Among the refresh addresses RX0 to RX12, the RX10 to RX12 that are upper three bits are supplied also to a determining circuit 25. The determining circuit 25 receives the RX10 to RX12, the upper three bits of the refresh address and selection signals SEL0 to SEL7 output from a segment address register 23 and compares these elements.

Figure 3:
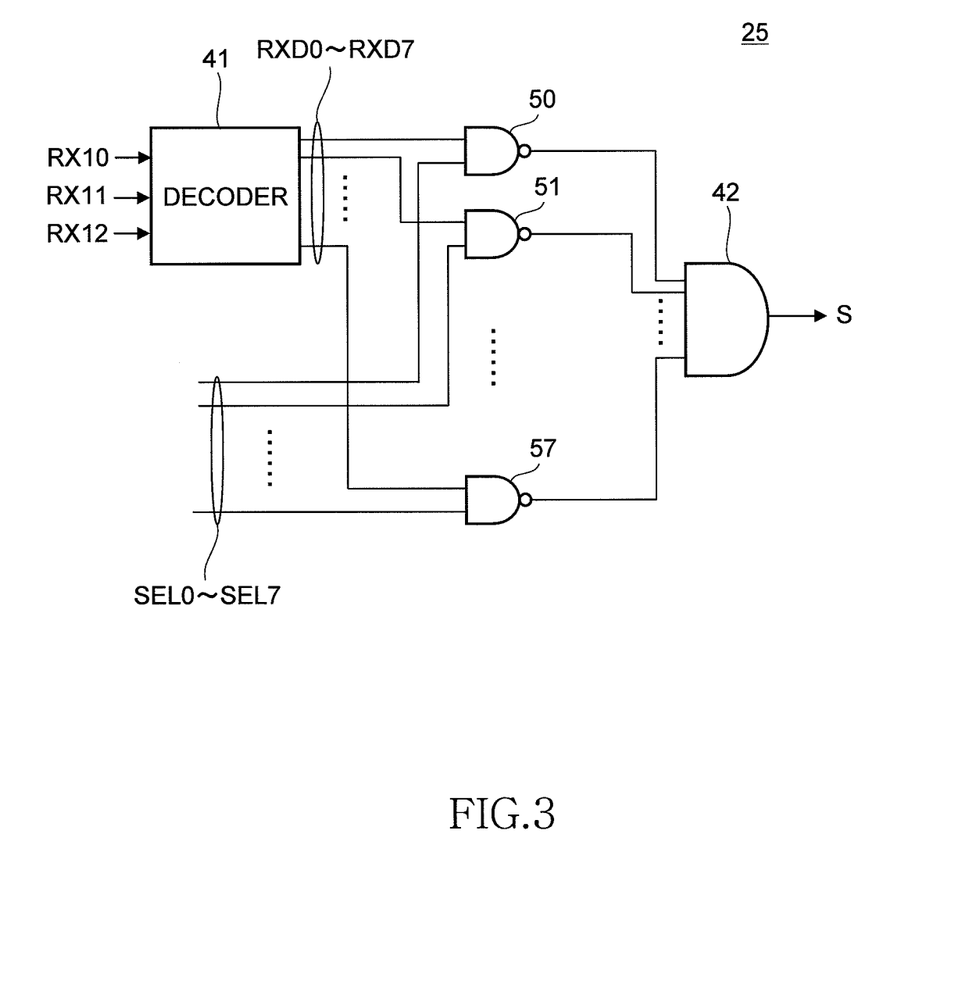
FIG. 3 is a circuit diagram of the determining circuit.

FIG. 3 is a circuit diagram of the determining circuit 25.

As shown in FIG. 3, the determining circuit 25 includes a decoder 41 that decodes the refresh addresses RX10 to RX12. The decoder 41 generates 8-bit decode signals RXD0 to RXD7 by decoding the refresh addresses RX10 to RX12.

More specifically, based on the refresh addresses RX10 to RX12, the decoder 41 sets one bit of the decode signals RXD0 to RXD7 at a high level, and sets the other seven bits thereof at a low level.

The determining circuit 25 is supplied with the 8-bit selection signals SEL0 to SEL7 supplied from the segment address register 23. In the selection signals SEL0 to SEL7, each bit is set at a high level or a low level based on the segment stored in the segment address register 23. Specifically, in the segment to which a refresh operation is designated, the corresponding selection signal is set at a low level, and in the segment to which no refresh operation is designated, the corresponding selection signal is set at a high level.

Accordingly, when the refresh operation is permitted for all of the segments (a first operation mode), the selection signals SEL0 to SEL7 are all set at a low level. In this case, among the memory cells designated by the refresh address, the memory cells belonging to all of the segments within the memory bank are refreshed. On the other hand, when the memory cell in the designated segment is refreshed and the memory cell in an undesignated segment is not refreshed (a second operation mode), at least one of the selection signals SEL0 to SEL7 is set at a high level.

As shown in FIG. 3, the selection signals SEL0 to SEL7 and the decode signals RXD0 to RXD7 are supplied to respectively corresponding NAND circuits 50 to 57. Outputs of the NAND circuits 50 to 57 are input to an 8-input AND circuit 42, and an AND obtained thereby is output as a determination signal S. In this configuration, the determination signal S is set to the low level only when at least one of the decode signals RXD0 to RXD7 and its corresponding selection signals SEL0 to SEL7 are both at active high level (refresh non-designation). Otherwise, the determination signal S is set at the high level.

The determination signal S is supplied to the refresh control circuit 22 shown in FIG. 1. The refresh control circuit 22 controls the refresh operation, and stops the refresh operation when the determination signal S is at a low level.

Figure 4:
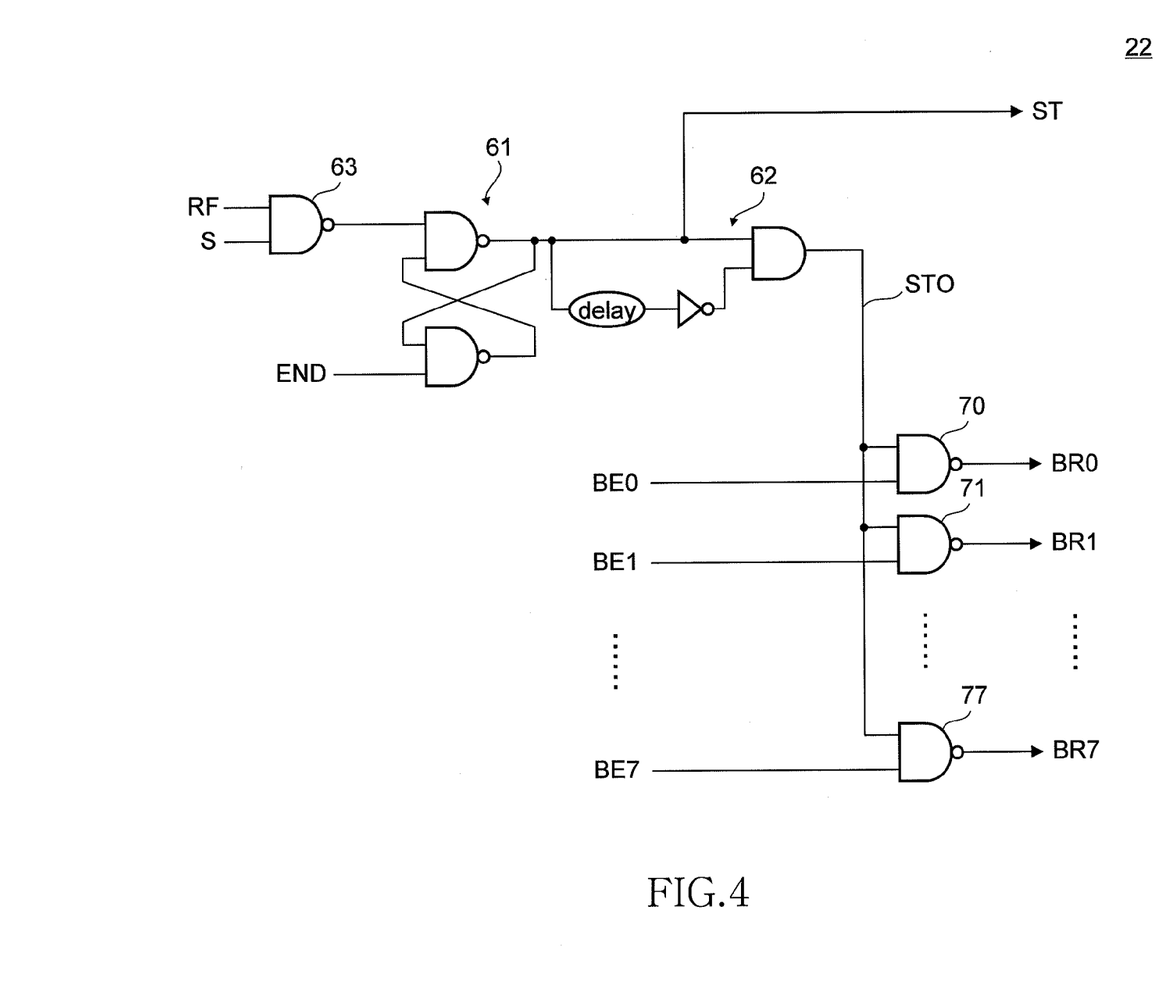
FIG. 4 is a circuit diagram of the refresh control circuit.

FIG. 4 is a circuit diagram of the refresh control circuit 22.

As shown in FIG. 4, the refresh control circuit 22 includes an SR latch circuit 61 that generates a refresh state signal ST and a one-shot-signal generating circuit 62 that generates a one-shot signal STO based on the refresh state signal ST.

The SR latch circuit 61 is a latch circuit set by an output from a NAND circuit 63 that receives the refresh command RF and the determination signal S and reset by a refresh end signal END. Accordingly, the SR latch circuit 61 is set when both the refresh command RF and the determination signal S are at a high level. On the other hand, even when the refresh command RF is at a high level, the SR latch circuit 61 is not set when the determination signal S is at a low level. That is, the NAND circuit 63 is configured as a gate circuit that prohibits setting of the SR latch circuit 61 when a match is detected by the determining circuit 25. In other words, when an address held at the segment address register 23 is first address information and a refresh address is second address information, if the determining circuit 25 determines that the second address information is included in the first address information, setting of the SR latch circuit 61 is prohibited.

The refresh end signal END represents a timing at which the refresh operation is completed, and is activated (from high to low) when a predetermined delay time is elapsed since the activation of the refresh state signal ST (from low to high).

The one-shot-signal generating circuit 62 generates the one-shot signal STO in response to the activation of the refresh state signal ST, and the generated one-shot signal STO is supplied commonly to NAND circuits 70 to 77. The NAND circuits 70 to 77 are supplied with respectively corresponding bank enable signals BE0 to BE7, and respective outputs are output as bank refresh signals BR0 to BR7.

In the bank enable signals BE0 to BE7, each bit is set at a high level or a low level based on the memory bank stored in the bank address register 24. Specifically, in the memory bank to which a refresh operation is designated, the corresponding enable signal is set at a high level, and in the memory bank to which no refresh operation is designated, the corresponding enable signal is set at a low level. Accordingly, when the one-shot signal STO is set at a low level, the bank enable signals BE0 to BE7 are blocked by the NAND circuits 70 to 77, and the bank refresh signals BR0 to BR7 are set at a high level (deactivated).

Figure 5:
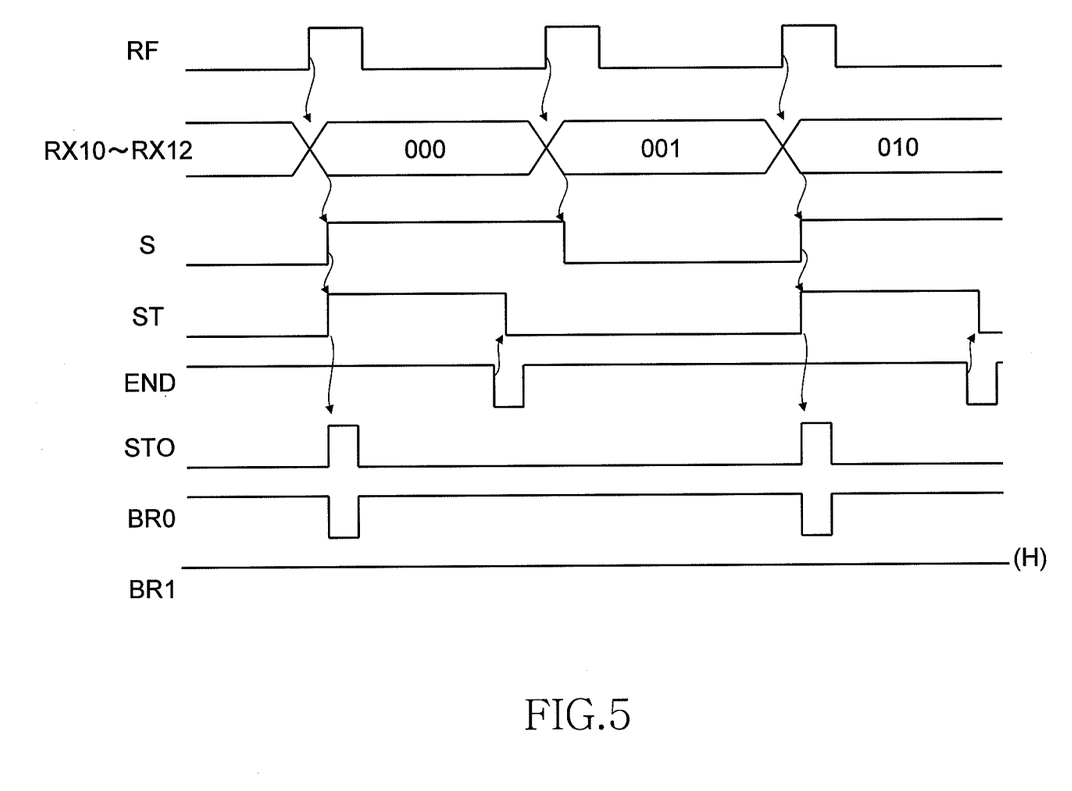
FIG. 5 is a timing chart showing an operation of the refresh control circuit.

FIG. 5 is a timing chart showing an operation of the refresh control circuit 22.

In an example shown in FIG. 5, the segment stored in the segment address register 23 is SEG1 (RX10 to RX12="001"), and the bank enable signal BE0 is at a high level and the bank enable signal BE1 is at a low level. That is, there is shown a state that the refresh operation to the segment SEG1 and the refresh operation to the memory bank BANK1 are prohibited. To simplify the description, only the segments SEG0 to SEG2 within the memory banks BANK0 and BANK1 are focused here.

As shown in FIG. 5, every time the refresh command RF is activated, the refresh address is incremented, and the RX10 to RX12 that are upper three bits of the refresh address are changed. In the example shown in FIG. 5, the RX10 to RX12 are changed as "000", "001", "010", .... When the RX10 to RX12 are "000" and "010", the determination signal S is at a high level (no match is detected). As a result, the SR latch circuit 61 shown in FIG. 4 is set by the refresh command RF and thus the refresh state signal ST is activated. In response thereto, the one-shot signal STO also is activated, and thus the bank refresh signal BR0 is activated. The reason for this is that the corresponding bank enable signal BE0 is at a high level. On the other hand, the bank refresh signal BR1 is not activated because the corresponding bank enable signal BE1 is at a low level.

Accordingly, in the memory bank BANK0, the refresh operation is performed on the segments SEG0 and SEG2 specified with RX10 to RX12="000" and "010". Upon completion of the refresh operation, the refresh end signal END is activated, and the SR latch circuit 61 is reset.

On the other hand, when the RX10 to RX12 are "001", because of the match detected by the determining circuit 25, the determination signal S is changed to a low level. Accordingly, the refresh state signal ST is not activated and fixed to a low level, and thus the one-shot signal STO is not activated, either. As a result, irrespective of levels of the bank enable signals BE0 to BE7, all of the bank refresh signals BR0 to BR7 are fixed at a deactivation state.

As a result, in all of the memory banks BANK0 to BANK7, the refresh operation for the segment SEG1 specified with RX10 to RX12="001" is prohibited.

As described above, the semiconductor memory device according to the present embodiment includes the bank address register 24 that designates the memory bank in which the refresh is performed, and the segment address register 23 that designates the segment in which the refresh is performed, and the semiconductor memory device performs a selective refresh based on the values set in these registers. Accordingly, only the memory cell within the memory bank designated by the bank address register 24, moreover, the memory cell belonging to the segment designated by the segment address register 23, is selectively refreshed. In other words, the refresh to the memory bank or the segment not designated by at least one of the bank address register 24 and the segment address register 23 is prohibited. Thus, it becomes possible to designate whether to perform a refresh operation in a more detailed manner as compared to the conventional techniques, and it becomes possible to reduce the power consumption during the refresh operation.

The selective refresh operation based on the value that is set to the registers is enabled in the refresh mode. However, the selective refresh operation is disabled in other operation modes that are entered in response to other commands such as active command, read command, write command, and the like. The semiconductor device according to the present invention is to reduce the power consumption by canceling the refresh operation with respect to a memory area in which the stored data is not to be saved. That is, an access to the memory area in the read/write operation is not prohibited. For example, when the first address information that is included in the plural address information stored in the address register is provided, the refresh operation is not performed to the memory cells assigned to the first address information if the first address information is provided in response to the refresh command. However, the row access during the read/write operation is performed to the memory cells assigned to the first address information if the first address information is provided in response to the active command, read command or write command. On the other hand, when the second address information that is not included in the plural address information stored in the address register is provided, not only the row access during the read/write operation in response to the active command, read command or write command but also the refresh operation in response to the refresh command is performed.

Figure 6:
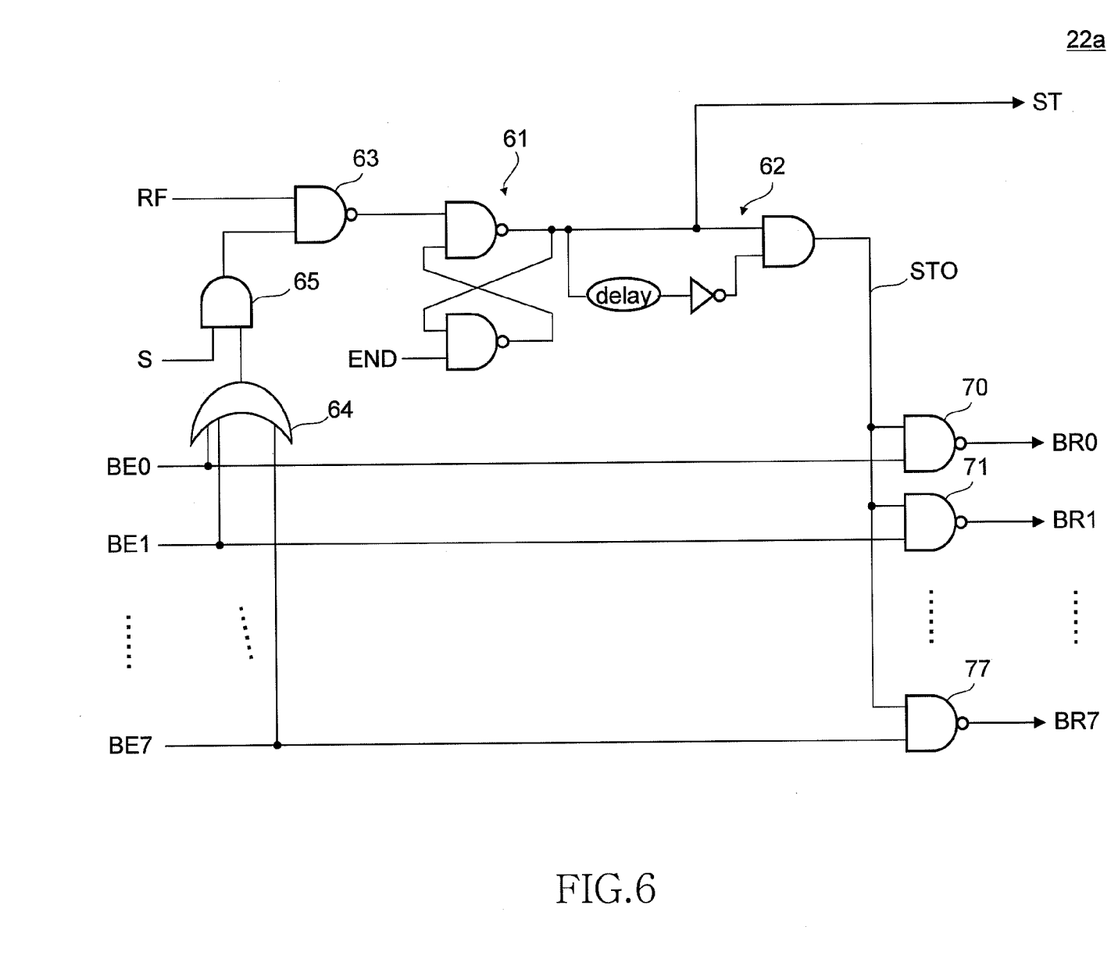
FIG. 6 is a circuit diagram showing a refresh control circuit according to another example.

FIG. 6 is a circuit diagram showing a refresh control circuit 22a according to another example.

An OR circuit 64 that receives the bank enable signals BE0 to BE7 and an AND circuit 65 that receives the output of the OR circuit 64 and the determination signal S are added to the refresh control circuit 22a shown in FIG. 6, in addition to the refresh control circuit 22 shown in FIG. 4. The output of the AND circuit 65 is input to the NAND circuit 63.

With the above configuration, when all of the bank enable signals BE0 to BE7 are at a low level, that is, the memory bank that becomes a refresh target is not designated, irrespective of the determination result of the determining circuit 25, the SR latch circuit 61 is not set. As a result, the refresh state signal ST is not activated either, and thus the power consumption in the one-shot-signal generating circuit 62 and the power consumption of another circuit (not shown) using the refresh state signal ST are reduced. This enables a further reduction of the power consumption.

Figure 7:
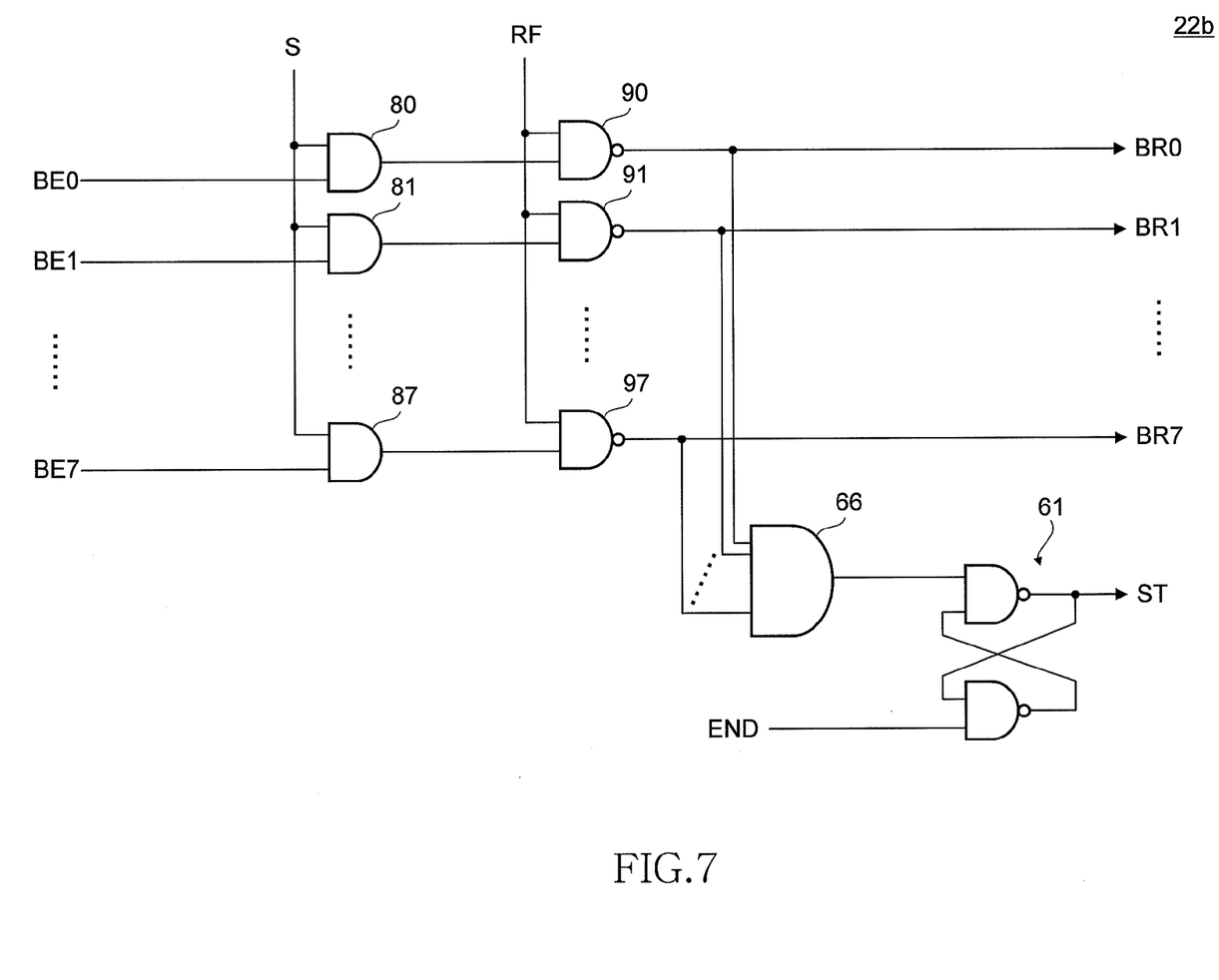
FIG. 7 is a circuit diagram showing a refresh control circuit according to still another example.

FIG. 7 is a circuit diagram showing a refresh control circuit 22b according to still another example.

The refresh control circuit 22b shown in FIG. 7 differs from the refresh control circuit 22 shown in FIG. 4 in that it includes AND circuits 80 to 87 that respectively receive the bank enable signals BE0 to BE7 and the determination signal S, and NAND circuits 90 to 97 that respectively receive the outputs from the AND circuits 80 to 87 and the refresh commands RF. Outputs from the NAND circuits 90 to 97 are used as the bank refresh signals BR0 to BR7, respectively.

The refresh control circuit 22b further includes an 8-input AND circuit 66 that receives the bank refresh signals BR0 to BR7, and the SR latch circuit 61 is set by the output from the AND circuit 66.

With the above configuration, similarly to the refresh control circuit 22a shown in FIG. 6, when all of the bank enable signals BE0 to BE7 are at a low level, that is, the memory bank that becomes a refresh target is not designated, the SR latch circuit 61 is not set irrespective of the determination result of the determining circuit 25. Accordingly, the refresh state signal ST is not activated either, and thus a further reduction of the power consumption is enabled as described above.

It is apparent that the present invention is not limited to the above embodiments, but may be modified and changed without departing from the scope and spirit of the invention.

For example, in the above embodiment, in the segment in which a refresh operation is prohibited, no refresh operation is performed on that segment of all of the banks. However, it is possible to independently designate the segment of each bank on which the refresh operation is performed by providing a segment address register 23 as shown in FIG. 1 for each bank.

Moreover, the memory bank does not always need to be divided into eight by the segment as described in the above embodiment. Accordingly, division of the memory bank into two can be performed by utilizing only a most significant bit of a row address within the memory bank.

What is claimed is:

1. A semiconductor device comprising:

at least one memory bank divided into a plurality of segments each including a plurality of memory cells;

a refresh counter that generates a refresh address, wherein among memory cells designated by the refresh address within the memory bank, memory cells belonging to all of the segments are refreshed in a first operation mode, and among the memory cells designated by the refresh address within the memory bank, memory cells in at least one designated segment are refreshed and memory cells in at least one undesignated segment are not refreshed in a second operation mode, a segment address register that stores a segment address not to be refreshed in the second operation mode;

a determining circuit that compares the segment address stored in the segment address register and the refresh address, wherein in the second operation mode, memory cells belonging to a segment corresponding to the refresh address in which a match is detected by the determining circuit is not refreshed, and a refresh control circuit including a latch circuit set at a time of starting a refresh operation and reset at a time of completing the refresh operation and a gate circuit that prohibits setting of the latch circuit when a match is detected by the determining circuit.

2. The semiconductor device as claimed in claim 1, further comprising:

a plurality of the memory banks; and a bank address register that designates a memory bank that the refresh operation is to be performed, wherein the refresh control circuit does not perform the refresh operation irrespective of a determination result by the determining circuit when no memory bank is designated by the bank address register.

3. The semiconductor device as claimed in claim 2, wherein the refresh control circuit prohibits setting of the latch circuit irrespective of the determination result by the determining circuit when no memory bank is designated by the bank address register.

* * * * *